United States Patent
Hara et al.

(10) Patent No.: US 8,502,447 B2
(45) Date of Patent: *Aug. 6, 2013

(54) IMAGE DISPLAY ELEMENT WITH DIVIDED BACK PANEL AND MANUFACTURING METHOD THEREOF

(75) Inventors: Zenichiro Hara, Tokyo (JP); Satoru Kiridoshi, Tokyo (JP); Suguru Nagae, Tokyo (JP); Takanori Okumura, Tokyo (JP); Yoshiyuki Suehiro, Tokyo (JP); Nobuo Terazaki, Tokyo (JP); Yutaka Saito, Yamagata (JP); Yuji Saito, Yamagata (JP); Toshinao Yuki, Yamagata (JP); Ryota Oki, Yamagata (JP); Takeshi Yoshida, Yamagata (JP); Jun Sugahara, Yamagata (JP); Hiroyuki Sato, Yamagata (JP); Yoshinori Fukuda, Yamagata (JP); Yosuke Sato, Yamagata (JP); Masami Kimura, Yamagata (JP)

(73) Assignees: Mitsubishi Electric Corporation, Chiyoda-Ku, Tokyo (JP); Tohoku Pioneer Corporation, Tendo-Shi, Yamagata (JP)

( * ) Notice: Subject to any disclaimer, the term of this patent is extended or adjusted under 35 U.S.C. 154(b) by 753 days.

This patent is subject to a terminal disclaimer.

(21) Appl. No.: 12/700,020

(22) Filed: Feb. 4, 2010

(65) Prior Publication Data
US 2010/0328192 A1      Dec. 30, 2010

(30) Foreign Application Priority Data

Jun. 26, 2009   (JP) ................................. 2009-152434

(51) Int. Cl.
*H05B 33/06*   (2006.01)
*H01J 17/49*   (2012.01)
*H01J 9/00*    (2006.01)

(52) U.S. Cl.
USPC ................ 313/512; 313/583; 445/24; 445/25

(58) Field of Classification Search
None
See application file for complete search history.

(56) References Cited

U.S. PATENT DOCUMENTS 4,982,134 A * 1/1991 Aono et al. .................... 313/456
6,556,261 B1   4/2003 Krusius et al.
(Continued)

FOREIGN PATENT DOCUMENTS

JP   3-022390 A   1/1991
JP   4-039892 A   2/1992
(Continued)

OTHER PUBLICATIONS

Machine English translation of JP 2005183106 to Iwata et al.*

(Continued)

*Primary Examiner* — Sikha Roy
(74) *Attorney, Agent, or Firm* — Buchanan Ingersoll & Rooney PC (57) ABSTRACT

An image display element includes: a front panel; a back panel opposite to the front panel; a plurality of pixels arranged in a matrix between both the panels, and to be selected to be in a display or non-display state; and plural electrodes for controlling the pixels. Both the panels are bonded together with the pixels and the electrodes interposed therebetween, and the electrodes are connected to a driving control circuit via metal wires. The back panel is divided such that electrode terminals connected to the electrodes are exposed between adjacent plural pixel lines, and a groove part having a shape wider at the top on the back side of the opposing surface from the front panel than at the bottom is formed at the divided portion. The metal wires are connected to the exposed electrode terminals of the groove part.

21 Claims, 6 Drawing Sheets

U.S. PATENT DOCUMENTS

| | | |
|---|---|---|
| 6,567,138 B1 | 5/2003 | Krusius et al. |
| 7,567,035 B2 * | 7/2009 | Terao et al. .................. 313/583 |
| 7,960,914 B2 * | 6/2011 | Hara et al. .................... 313/583 |
| 8,272,911 B2 * | 9/2012 | Hara et al. ...................... 445/24 |
| 2006/0193117 A1 * | 8/2006 | Miyata .......................... 361/749 |
| 2012/0074422 A1 * | 3/2012 | Kanegae et al. ................ 257/72 |

FOREIGN PATENT DOCUMENTS

| | | |
|---|---|---|
| JP | 5-159877 A | 6/1993 |
| JP | 11-111454 A | 4/1999 |
| JP | 2001-034190 A | 2/2001 |
| JP | 2001-251571 A | 9/2001 |
| JP | 2005-183106 A | 7/2005 |
| JP | 2008-191502 A | 8/2008 |
| TW | 581993 B | 4/2004 |

OTHER PUBLICATIONS

Machine English translation of JP2008191502 to Hara et al.*

Office Action dated Feb. 17, 2013, issued by the Chinese Patent Office in the corresponding Chinese Application No. 201010119575.7 and an English translation thereof. (32 pages).

* cited by examiner

IMAGE DISPLAY ELEMENT WITH DIVIDED BACK PANEL AND MANUFACTURING METHOD THEREOF

BACKGROUND OF THE INVENTION

1. Field of the Invention

The present invention relates to an image display element for use in a large size display including, for example, a large number of liquid crystal display (LCD) panels, plasma display panels (PDP), or electroluminescent (EL) display panels, arranged therein, and a manufacturing method thereof.

2. Background Art

In recent years, the mainstream of large size displays has been of the system in which a large number of LEDs are arranged. Such a large size display of the LED system increases in arrangement density of LEDs with an increase in resolution, resulting in a high cost. On the other hand, in order to implement a large size display at a low cost, effective is the system in which a plurality of flat panel displays (e.g., LCD panels, PDPs, or EL display panels) as image display elements (or, display units) are arranged in a matrix.

A conventional image display element forming such a large size display has a front panel and a back panel formed of a glass plate or the like as shown in JP-A-2008-191502. The front panel and the back panel are opposed each other with a prescribed distance therebetween, between which a plurality of pixels, and a plurality of electrodes for controlling them are arranged to form a light emitting layer (or a liquid crystal layer). Thus, the periphery thereof is sealed with a seal part. A plurality of the electrodes are applied with control signals including a scanning signal and a data signal from a driving control circuit disposed on the back side of the image display element. As the electrode lead-out systems for applying control signals to the electrodes, there are an end face lead-out system in which a step part is disposed at the periphery of the image display element, namely, at each joint part between the adjacent image display elements, so that electrode lead lines are connected to the electrode terminals at the step part (FIG. 3 of JP-A-2008-191502); and a center lead-out system in which the back panel is divided, and a groove part is disposed at the central part, and electrode lead lines are disposed at electrode terminals disposed at the groove part (FIG. 1 of JP-A-2008-191502).

In the case where a large number of such image display elements are arranged, when the spacing between the pixels of the adjacent image display elements at the joint part is larger than the spacing between pixels in the same image display element, the joint part becomes noticeable.

Thus, with the foregoing end face lead-out system, it is necessary to form the step part of the end part as thin as possible with a high precision. Whereas, with the center lead-out system, the spacing between pixels in the same image display element can be more shortened as compared with the end face lead-out system. However, the groove part is still required to be formed as narrow as possible with a high precision.

Thus, the end face lead-out system has an effect capable of leading out electrodes from the end part of the panel with ease. However, a problem is encountered in the panel shape in the vicinity of the terminal part for disposing the electrode lead line thereon, so that lead-out processing of electrodes becomes difficult. Examples of the electrode lead-out processing method include soldering, wire bonding, and connection by a conductive paste. However, at the step part in the vicinity of the terminal part occurring according to the thickness of the back panel, jigs and tools such as needles and heads for electrode lead-out processing (which will be hereinafter referred to as processing tools) become less likely to reach the terminal part situated at the recesses of the step part.

Further, with the center lead-out system, the lead line of the electrode is led out from the groove part formed at the back panel. Therefore, this configuration is effective as the structure for making the joint parts of the image display elements less noticeable. However, at the groove part in the vicinity of the terminal part occurring according to the thickness of the back panel, the processing tools are still less likely to reach the terminal part situated at the recesses of the groove part. Particularly, a large size display decreases in pixel pitch with an increase in resolution. However, it is also necessary to narrow the width of the terminal part for disposing an electrode lead line thereon according to the decrease in pixel pitch. Accordingly, electrode lead-out processing becomes further difficult. Thus, with the structure of a conventional image display element, it has been difficult to implement a high-resolution large size display by a decrease in gap between pixels when panels are arranged.

SUMMARY OF THE INVENTION

This invention has been made in order to solve the foregoing problem. It is an object of the present invention to provide an image display element capable of readily undergoing electrode lead-out processing by configuring the panel shape in the vicinity of the terminal part of the image display element in a structure suitable for use of processing tools necessary for electrode lead-out processing, and a manufacturing method thereof.

In accordance with an aspect of this invention, an image display element includes: a front panel; a back panel opposite to the front panel; a plurality of pixels arranged in a matrix between both the panels, and to be selected to be in a display or non-display state; and a plurality of electrodes for controlling the pixels. Both the panels are bonded together with the pixels and the electrodes interposed therebetween, and the electrodes are connected to a driving control circuit via metal wires. In such an image display element, the back panel is divided such that electrode terminals connected to the electrodes are exposed between adjacent plural pixel lines. In addition, a groove part having a shape wider at the top on the back side (back surface side) of the opposing surface from the front panel than at the bottom is formed at the divided portion, and the metal wires are connected to the exposed electrode terminals of the groove part.

Further, another aspect of this invention provides a method for manufacturing an image display element including a front panel; a back panel opposite to the front panel; a plurality of pixels arranged in a matrix between both the panels, and to be selected to be in a display or non-display state; and a plurality of electrodes for controlling the pixels, both the panels being bonded together with the pixels and the electrodes interposed therebetween, and the electrodes being connected to a driving control circuit via metal wires. Such a method includes: a first step of dividing the back panel such that electrode terminals connected to the electrodes are exposed between adjacent plural pixel lines, and forming a groove part having a shape wider at the top on the back side (back surface side) of the opposing surface from the front panel than at the bottom at the divided portion; and a second step of forming the metal wires so as to be connected to the exposed electrode terminals of the groove part.

In accordance with the invention, it becomes possible to readily lead out electrodes from a narrow region of the panel. Accordingly, when a plurality of image display elements are arranged in a matrix, the joint parts can be narrowed in width. This can implement a high-resolution large-size display with unnoticeable joint parts.

The foregoing and other object, features, aspects, and advantages of the present invention will become more apparent from the following detailed description of the present invention when taken in conjunction with the accompanying drawings.

DESCRIPTION OF THE PREFERRED EMBODIMENTS

Embodiment 1

Figure 1:
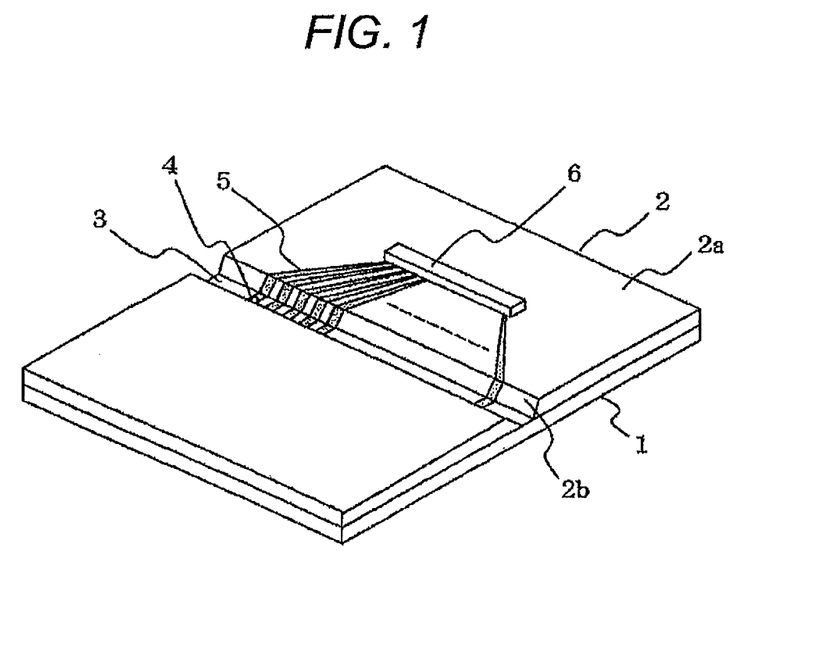
FIG. 1 is a perspective view showing an image display element in accordance with Embodiment 1 of the present invention.
Figure 2:
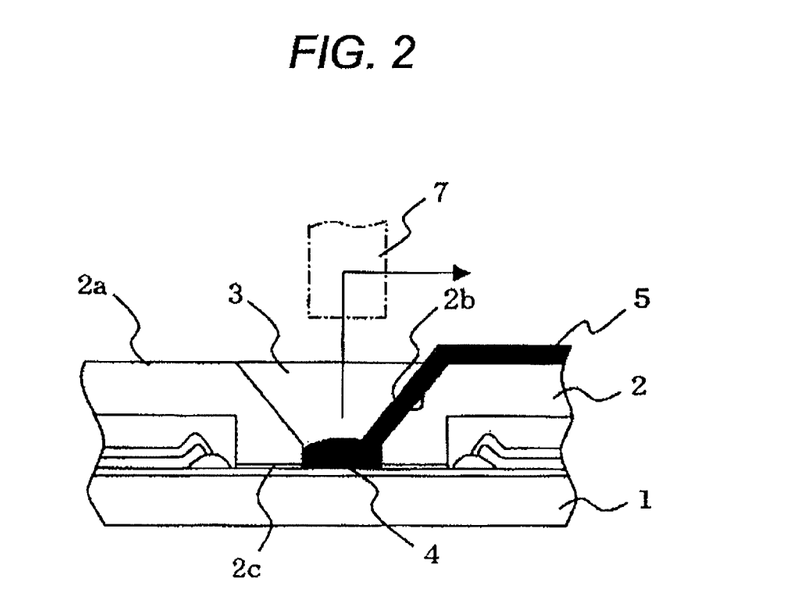
FIG. 2 is an enlarged cross-sectional view of an essential part of FIG. 1.

FIG. 1 is a perspective view showing an image display element in accordance with Embodiment 1 of this invention, and FIG. 2 is an enlarged cross-sectional view of an essential part of FIG. 1. A large number of the image display elements are arranged in a matrix to form a large screen flat panel display. Examples of the display device of the image display element include a LCD panel, a PDP, and an EL display panel. Incidentally, the figure shows the image display element as seen from the back thereof.

As shown in FIG. 1, the image display element includes a front panel 1 formed of a glass plate or the like, a back panel 2 similarly formed of a glass plate or the like, and opposed to the front panel 1, a plurality of pixels (not shown) arranged in a matrix between both the panels, and to be selected to be in a display or non-display state, and a plurality of electrodes (not shown) for controlling the pixels. Both the panels 1 and 2 are bonded with each other with the pixels and the electrodes interposed therebetween. Incidentally, plurality of the electrodes include row electrodes to be applied with scanning signals, and column electrodes to be applied with data signals.

The back panel 2 is divided in such a manner as to form a groove part 3 having a tilt surface by cutting using a dicing blade (which will be hereinafter referred to as dicing), or the like between the adjacent plural pixel lines. The groove part 3 is desirably in a V shape in cross section. Incidentally, in the figure, the groove part 3 is shown on an enlarged scale for easy understanding, but in actuality, it is a minute gap. Further, the pixels are arranged in a matrix. Thus, when a reference is made to "between pixels", there are "between transverse pixel rows" and "between longitudinal pixel columns". However, both inclusive are referred to as "between two adjacent pixel lines".

Then, on the front panel 1 side situated at the groove part 3, a plurality of electrode terminals 4 connected to the electrodes are arranged. The electrode terminals 4 are formed of, for example, the same material as that for the electrodes simultaneously, and are exposed from the groove part 3.

On the other hand, on a back surface 2a of the back panel 2 (the back side of the opposing surface from the front panel is referred to as "back surface"; the same applies hereinafter), and on an end face 2b of the groove part 3, metal film wires 5 are formed. To the end parts of the metal film wires 5 on the back surface 2a side, a connector 6 is connected. The metal film wires 5 are connected to an external driving control circuit via the connector 6.

The details of the wiring part are shown in FIG. 2. As shown in the figure, the wiring part is formed by performing alignment such that the metal film wires 5 on the end face 2b of the back panel 2 are in contact with the electrode terminals 4 on the front panel 1 side with the back panel 2 bonded on the front panel 1. Incidentally, in FIG. 2, 2c denotes a seal part by a filling material coated on the inside of the back panel 2.

Herein, the back panel 2 is generally formed of glass. For this reason, the metal film wires 5 are coated by thick film printing using a conductive paste such as silver (Ag), followed by sintering. In this case, in order to perform thick film printing, the processing tool necessary for thick film printing is required to be moved in proximity to the end face 2b of the back panel 2. However, when the end face 2b of the back panel 2 is vertical, and the width of the groove part 3 is, for example, 0.30 mm, which is smaller than the width dimension of the tool (e.g., 0.36 mm), or in other cases, thick film printing becomes difficult to properly perform. Incidentally, herein, thick film printing is taken as an example. However, the same can also be said for a method using a dispenser or a method using ink jet, which is common as the method for forming a conductive paste.

In contrast, in Embodiment 1, in the divided portion of the back panel 2, the groove part 3 having a V shape wider at the top on the back surface 2a side than at the bottom is formed. Therefore, as indicated with an arrow of FIG. 2, a tool 7 necessary for thick film printing can be moved in proximity to the groove part 3 of the back panel 2. This enables the metal film wires 5 to be formed along the groove part 3 with ease and precision.

Thus, by forming the metal film wires 5 with ease and precision, the reliability of wiring is enhanced as compared with a conventional case by a lead line.

Incidentally, the materials for the metal film wires 5 are not limited to Ag, and common wiring materials may be used. Further, other wiring structures such as FPC (flexible printed circuit board) may be included between the metal film wires 5 and the connector 6.

Figure 3:
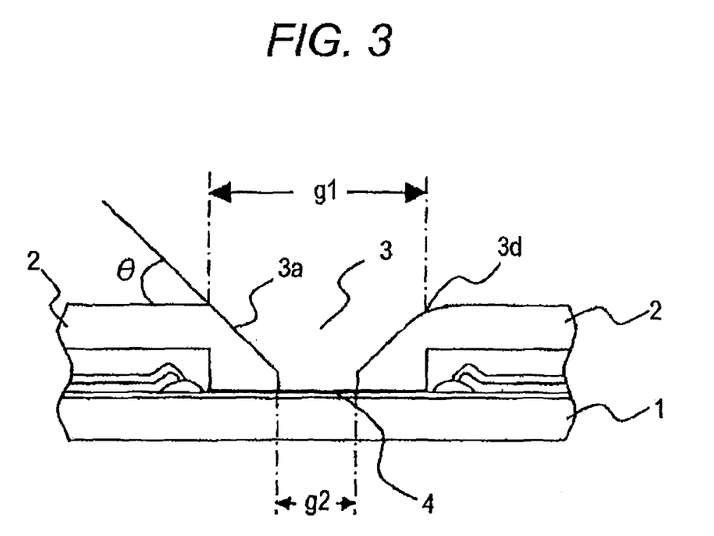
FIG. 3 is an enlarged cross-sectional view of an essential part showing a modified example of the groove part of a back panel in Embodiment 1.

Incidentally, the groove part 3 having the V shape is formed such that a top dimension g1 is wider than a bottom dimension g2 as shown in FIG. 3. However, in consideration of actual processing, the ratio of g1 and g2 is selected, for example, as follows: g1:g2=3.8 to 17.2:1 when the thickness of the back panel 2 is 0.7 mm, the tilt angle at the tilt part 3a of the groove part 3 falls within the range of 30° to 55°, and the width dimension of the electrode terminal 4 falls within the range of 0.15 to 0.35 mm; and g1:g2=3.0 to 12.5:1 when the thickness of the back panel 2 is 0.5 mm, the tilt angle at the tilt part 3a of the groove part 3 falls within the range of 30° to 55°, and the width dimension of the electrode terminal 4 falls within the range of 0.4 to 0.6 mm. When this ratio is less than 3.0, the reliability of the electrode lead-out part is reduced. Whereas, when the ratio exceeds 17.2, the strength of the back panel 2 is reduced.

Whereas, when the tilt angle θ (see FIG. 3) at the tilt part 3a of the groove part 3 is set within the range of 40°≦θ≦45° with reference to 45°, use of the processing tool for metal film wire formation becomes easy. Whereas, when the tilt angle θ is set within the range of 45°≦θ≦60°, the formation of the metal film wires using fluidity of a conductive paste becomes possible.

Further, as shown in FIG. 3, by forming a R surface 3d at the edge portion of the top of the groove part 3, damage to the metal film wires 5 can be reduced, which can further enhance the reliability.

Figure 4:
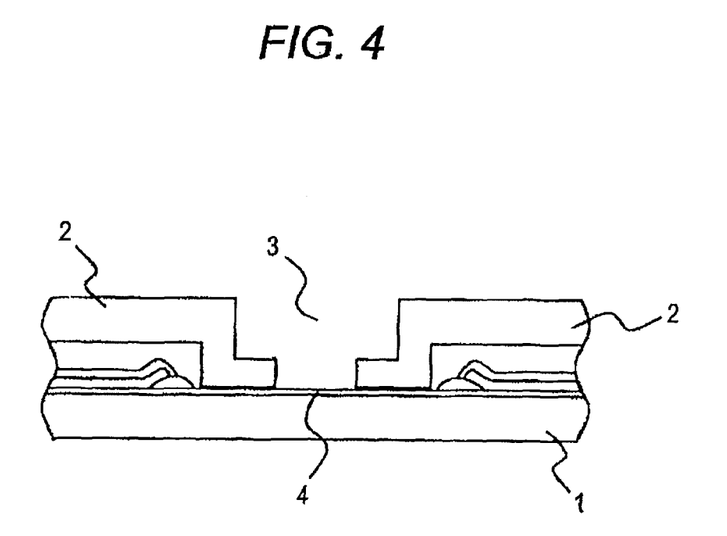
FIG. 4 is an enlarged cross-sectional view of an essential part showing a modified example of the groove part of the back panel in Embodiment 1.

Incidentally, in the foregoing example, there was shown the case where the groove part 3 having a V shape wider at the top than at the bottom is formed at the divided portion of the back panel 2. However, the groove part 3 may also be in a step form as shown in FIG. 4. In this case, an enlargement in width of the top of the groove part 3 can more facilitate application of equipment and tools necessary for electrode lead-out. Also in the case of such a stepped groove part, it is effective to form a R surface at the edge portion in which the metal film wires come in contact. The description was given to the case where the shape of the divided cross section of the back panel 2 is a V shape. However, the present application is not limited thereto. Also acceptable are not only the V-shaped groove part 3 forming tilt surfaces on the opposite sides of the divided cross section of the back panel 2, but also the groove part 3 forming a tilt surface only on one side.

Further, in Embodiment 1, there is shown the case where the back panel 2 is divided into two parts at the central part as one example. However, the number of divisions and the position for division are not limited thereto. The back panel 2 may be divided into three or more parts, and the position for division may also be another position so long as it is between adjacent pixels. For example, as shown in FIG. 5, the back panel 2 is divided into four parts by the cross-shaped groove part 3, which is also applicable to the center lead-out system in which electrodes are led out crosswise from the center of the image display element 1.

Figure 5:
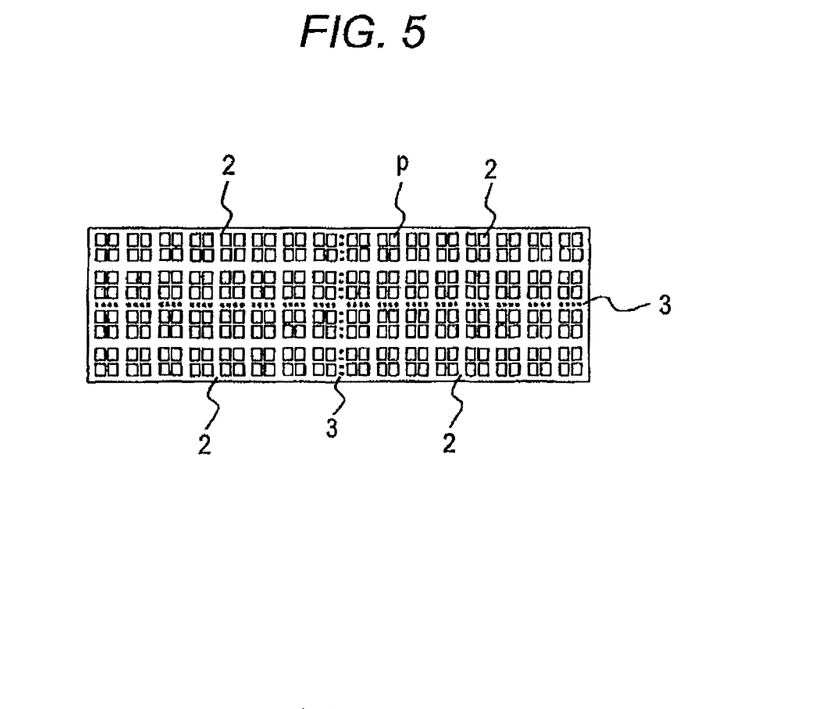
FIG. 5 is a schematic plan view showing another image display element to which Embodiment 1 is applicable.

Incidentally, FIG. 5 shows a panel before the metal wires for electrode lead-out are formed. A reference sign P in the drawing denotes pixels arranged longitudinally and latitudinally.

Embodiment 2

Figure 6:
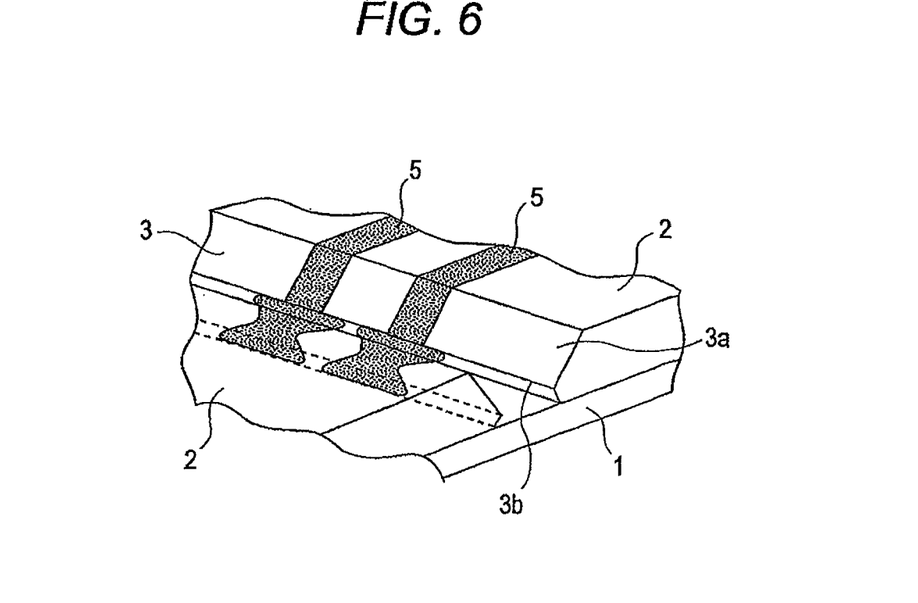
FIG. 6 is an enlarged perspective view of an essential part showing an image display element in accordance with Embodiment 2 of this invention.

FIG. 6 is a perspective view of an essential part showing an image display element according to Embodiment 2 of this invention. An overhang part 3b is formed midway along a tilt part 3a of the V-shaped groove part 3 in Embodiment 1. This allows a conductive paste to expand in the direction of the side of the groove part 3 at the overhang part 3b when the metal film wires 5 are formed by thick film printing.

With such a configuration, it is possible to more enhance the adhesion of the metal film wires 5, and it is possible to increase the contact area with the groove part 3, and to reduce the contact resistance.

The overhang part 3c as shown in FIG. 6 can be formed in the following manner.

Figure 7:
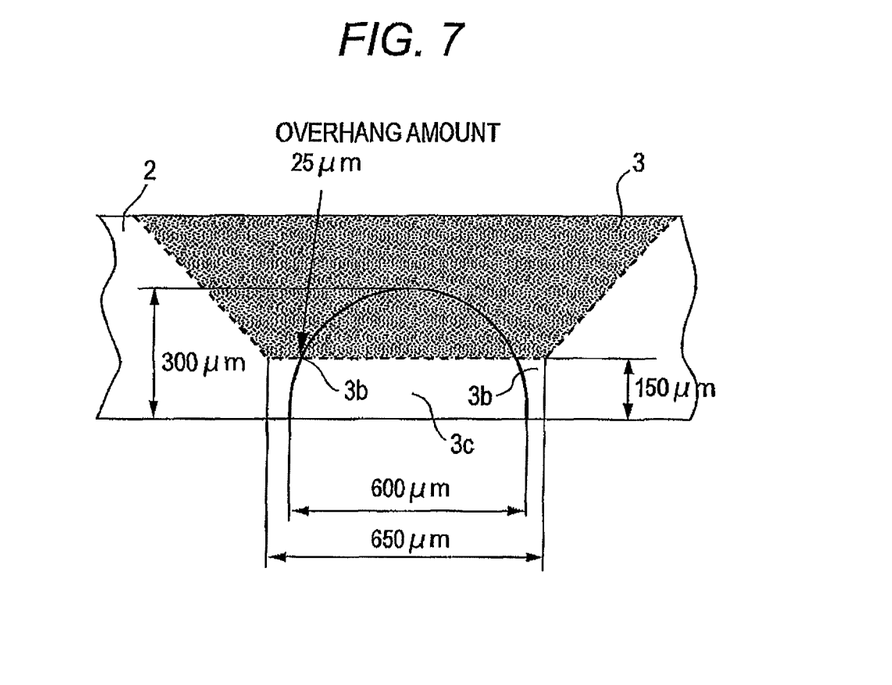
FIG. 7 is an enlarged cross-sectional view of an essential part showing a modified example of the groove part of a back panel in Embodiment 2.
Figure 8:
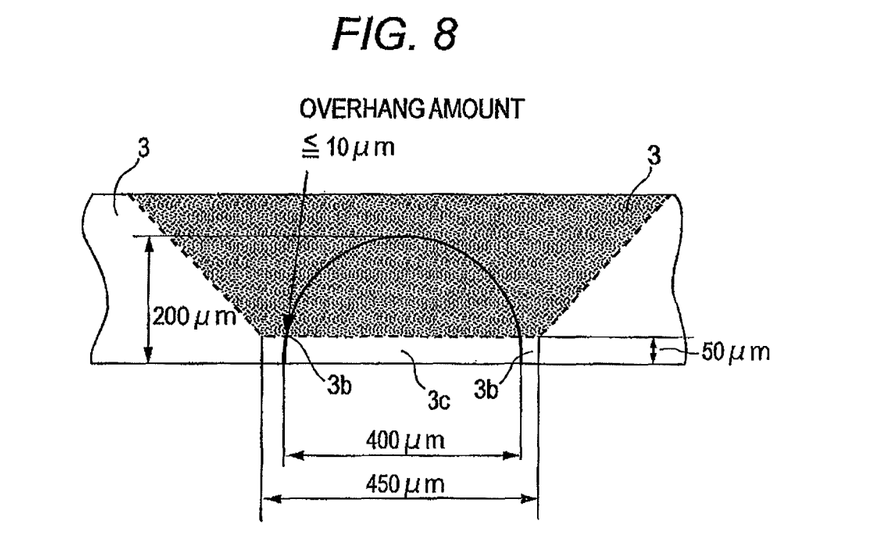
FIG. 8 is an enlarged cross-sectional view of an essential part showing a modified example of the groove part of the back panel in Embodiment 2.

First, as shown in FIGS. 7 and 8, in the portion for forming therein the groove part 3 of the back panel 2, a concave part 3c half-round in cross section is formed by counterboring or the like from the side of the opposing surface from the front panel 1. Thereafter, the V-shaped groove part 3 is formed to a depth such that the base thereof crosses with the concave part 3c to form a prescribed overhang part 3b by dicing or the like from the back surface 2a side.

According to such a method, by appropriately setting the opening dimension of the concave part 3c and the thickness of the base of the groove part 3, it is possible to determine the overhang amount of the overhang part 3b.

FIG. 7 shows a case where the opening dimension of the concave part 3c is set at 600 μm (counterboring amount radius 300 μm), and the thickness of the base of the groove part 3 is set at 150 μm, and the overhang amount is set at 25 μm. FIG. 8 shows a case where the opening dimension of the concave part 3c is set at 400 μm (counterboring amount radius 200 μm), and the thickness of the base of the groove part 3 is set at 50 μm, and the overhang amount is set at 10 μm or less.

Embodiment 3

Figure 9:
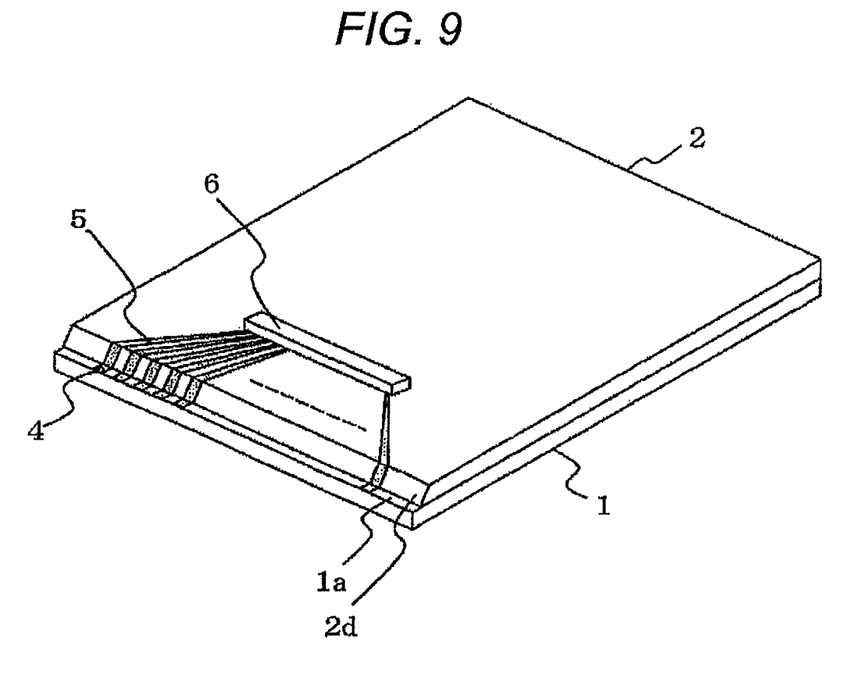
FIG. 9 is a perspective view showing an image display element in accordance with Embodiment 3 of this invention.
Figure 10:
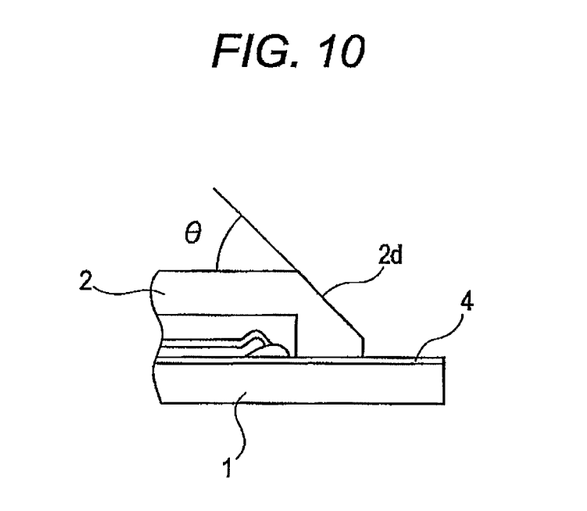
FIG. 10 is an enlarged cross-sectional view of an essential part showing a modified example of the end part of a back panel in Embodiment 3.

FIG. 9 is a perspective view showing an image display element according to Embodiment 3 obtained by applying this invention to the structure of the end face lead-out system in which electrodes are led out from the end face of the image display element. FIG. 10 is an essential part enlarged cross-sectional view showing an essential part of FIG. 9 in a cut-away view.

In FIG. 9, the back panel 2 is slightly smaller than the front panel 1. Thus, upon superposition thereof, a step part 1a is formed at the end part to expose the electrode terminals 4. In addition, a tilt part 2d is formed at the end part of the back panel 2 rising from the step part 1a. The metal film wires 5 for connecting the electrode terminals 4 to the connector 6 are formed along the tilt surface.

Thus, by forming the tilt part 2d at the end part of the back panel 2, the processing tool necessary for thick film printing or the like can be moved in proximity to the tilt part 2d of the back panel 2. This enables the metal film wires 5 to be formed along the tilt part 2d with ease and precision. Thus, the reliability of wiring is enhanced as compared with a conventional case by a lead line.

Incidentally, also in this case, as shown in FIG. 10, when the tilt angle θ at the tilt part 2d is set within the range of 40°≦θ≦45° with reference to 45°, use of the processing tool for metal film wire formation becomes easy. Whereas, when the tilt angle θ is set within the range of 45°≦θ≦60°, the formation of the metal film wires using fluidity of a conductive paste becomes possible.

Further, by forming a R surface at the edge portion of the top of the tilt part 2d, damage to the metal film wires 5 can be reduced, which can further enhance the reliability.

Figure 11:
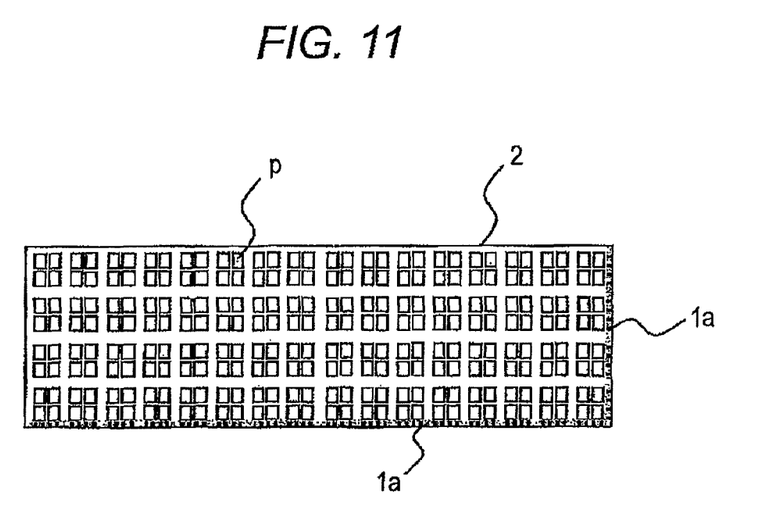
FIG. 11 is a schematic plan view showing another image display element to which Embodiment 3 is applicable.

Further, this configuration is also applicable to the end face lead-out system in which electrodes are led out from orthogonal both end sides of the image display element 1, for example, as shown in FIG. 11. Incidentally, FIG. 11 shows a panel before the metal wires for electrode lead-out are formed. A reference sign P in the drawing denotes pixels arranged longitudinally and latitudinally.

Incidentally, in the foregoing respective embodiments, there was shown the case where the metal film wires by a conductive paste are used as wires for electrode lead-out. However, this invention is not limited thereto, and is also effective for the case using a method such as wire bonding or soldering.

Embodiment 4

In order to illustrate the relationship between the electrode terminals 4 and the pixels of the image display element 1 of a large size display of the invention, a description will be given to a case using an EL display panel as one example of the image display element. This case is an example in which the image display element of FIG. 1 is formed of an EL display panel. Incidentally, the image display element of the invention is not limited thereto, and is also applicable to a liquid crystal panel, a PDP, and the like.

On the front panel 1, a plurality of organic EL elements which are pixels p are arranged to control light emission/non-light emission of the pixels (each pixel p of FIG. 5 is one organic EL element). A general organic EL element includes a transparent electrode such as ITO, an organic layer including a hole transport material layer, a light emission layer, an electron transport layer, and the like, and a reflection electrode (e.g., Al), successively formed therein. Thus, light transmits through the transparent electrode from the light emission layer, and is emitted from the front panel 1 side.

The electrode terminal 4 and the transparent electrode and the reflection electrode are electrically connected, and the electrode terminal 4 is led out to the groove part 3. Via the metal film wire 5, (the transparent electrode and the reflection electrode) are electrically connected with the connector 6. Thus, a control signal indicative of light emission/non-light emission of the organic EL element is sent from an external driving control circuit. The electrode terminal may be formed of the same ITO as that of the transparent electrode. In order to reduce the resistance, the electrode terminal may be formed of a low resistance metal such as Al, Cr, or Ag. Alternatively, it may be formed of a lamination thereof.

The back panel 2 may be formed of glass as with the front panel 1. In the side of the back panel 2 opposite to the organic EL elements, a concave part is formed with etching, sand blast, or the like. The panels 1 and 2 are bonded together so that the concave part-formed side of the back panel 2 and the organic EL elements-formed side of the front panel 1 oppose each other. Both the substrates are sealed and joined by an UV-curable adhesive or the like. In the sealed space by the concave part, a desiccating agent is set for protection from the deteriorating factors of the organic EL elements such as moisture.

Various modifications and alterations of this invention will be apparent to those skilled in the art without departing from the scope and spirit of this invention, and it should be understood that this is not limited to the illustrative embodiments set forth herein.

What is claimed is:

1. An image display element, comprising:
   a front panel;
   a back panel opposite to the front panel;
   a plurality of pixels arranged in a matrix between both the panels, to be selected to be in a display or non-display state; and
   a plurality of electrodes for controlling the pixels,
   both the panels being bonded together with the pixels and the electrodes interposed therebetween, and the electrodes being connected to a driving control circuit via metal wires, wherein
   the back panel is divided such that electrode terminals connected to the electrodes are exposed between adjacent plural pixel lines, and a groove part having a shape wider at the top on the back side (back surface side) of the opposing surface from the front panel than at the bottom is formed at the divided portion, and
   the metal wires are connected to the exposed electrode terminals of the groove part;
   wherein the groove part has a tilt surface; and
   wherein the groove part has an overhang part midway along the tilt surface of the groove part.

2. The image display element according to claim 1, wherein the groove part has a V shape in cross section.

3. The image display element according to claim 1, wherein the tilt part of the groove part has a tilt angle of 40° to 60°.

4. The image display element according to claim 1, wherein the groove part includes a R surface formed on the edge part of the top thereof.

5. The image display element according to claim 1, wherein the groove part has a ratio of the width dimensions of the top and the bottom set at 3.0 to 17.2:1.

6. The image display element according to claim 1, wherein the groove part has a stepped shape in cross section.

7. The image display element according to claim 1, wherein the metal wires are metal film wires formed along the surface of the groove part.

8. The image display element according to claim 7, wherein the metal film wires are formed by thick film printing.

9. The image display element according to claim 1, wherein the groove part is formed in such a manner as to divide the whole back panel crosswise.

10. An image display element, comprising:
    a front panel;
    a back panel opposite to the front panel;
    a plurality of pixels arranged in a matrix between both the panels, to be selected to be in a display or non-display state; and
    a plurality of electrodes for controlling the pixels,
    both the panels being bonded together with the pixels and the electrodes interposed therebetween, and the electrodes being connected to a driving control circuit via metal wires, wherein
    the back panel has a tilt part having a shape wider at the top on the back side (back surface side) of the opposing surface from the front panel than at the bottom, at the end part at which electrode terminals connected to the electrodes are exposed, and
    the metal wires are formed along the tilt part;
    wherein an overhang part is formed midway along the tilt part.

11. A method for manufacturing an image display element, the image display element, comprising:
    a front panel;
    a back panel opposite to the front panel;
    a plurality of pixels arranged in a matrix between both the panels, to be selected to be in a display or non-display state; and
    a plurality of electrodes for controlling the pixels, both the panels being bonded together with the pixels and the electrodes interposed therebetween, and the electrodes being connected to a driving control circuit via metal wires, the method, comprising:

a first step of dividing the back panel such that electrode terminals connected to the electrodes are exposed between adjacent plural pixel lines, and forming a V-shaped groove part having a shape wider at the top on the back side (back surface side) of the opposing surface from the front panel than at the bottom at the divided portion; and a second step of forming the metal wires so as to be connected to the exposed electrode terminals of the groove part;

wherein the groove part has a tilt surface; and a step of forming a concave part in the portion corresponding to the divided portion of the back panel on the side opposite to the front panel, forming the V-shaped groove part such that the bottom crosses with the concave part from the back side (back surface side) of the opposing surface from the front panel, and forming an overhang part midway along the tilt surface of the V-shaped groove part.

12. The method for manufacturing an image display element according to claim 11, wherein the groove part is formed so as to have a V shape in cross section.

13. The method for manufacturing an image display element according to claim 12, wherein the tilt part of the groove part is formed so as to have a tilt angle of 40° to 60°.

14. The method for manufacturing an image display element according to claim 11, wherein the groove part is formed so as to have a R surface at the edge part of the top thereof.

15. The method for manufacturing an image display element according to claim 11, wherein the groove part is formed such that the ratio of the width dimensions of the top and the bottom is 3.0 to 17.2:1.

16. The method for manufacturing an image display element according to claim 11, wherein the groove part is formed so as to have a stepped shape in cross section.

17. The method for manufacturing an image display element according to claim 11, wherein the metal wires are formed of metal film wires along the surface of the groove part.

18. The method for manufacturing an image display element according to claim 17, wherein the metal film wires are formed by thick film printing.

19. The method for manufacturing an image display element according to claim 11, wherein the groove part is formed in such a manner as to divide the whole back panel crosswise.

20. The method for manufacturing an image display element according to claim 11, wherein the metal wires are formed so as to be connected to the electrode terminals beyond the overhang part of the groove part by thick film printing.

21. A method for manufacturing an image display element, the image display element, comprising:

a front panel;

a back panel opposite to the front panel;

a plurality of pixels arranged in a matrix between both the panels, to be selected to be in a display or non-display state;

a plurality of electrodes for controlling the pixels, both the panels being bonded together with the pixels and the electrodes interposed therebetween, and the electrodes being connected to a driving control circuit via metal wires, the method, comprising:

a first step of forming a tilt part having a shape wider at the top on the back side (back surface side) of the opposing surface from the front panel than at the bottom, at the end part of the back panel at which electrode terminals connected to the electrodes are exposed, and a second step of forming the metal wires so as to be connected to the exposed electrode terminals along the tilt part; and a step of forming an overhang part midway along the tilt part.

* * * * *